(12) United States Patent
Choi

(10) Patent No.: US 8,000,912 B2
(45) Date of Patent: Aug. 16, 2011

(54) INSTRUMENT TRANSFORMER AND APPARATUS FOR DETECTING AN AMOUNT OF POWER USING THE SAME

(75) Inventor: Jae Gon Choi, Chungcheongbuk-do (KR)

(73) Assignee: LS Industrial Systems Co., Ltd., Gyeonggi-Do (KR)

( * ) Notice: Subject to any disclaimer, the term of this patent is extended or adjusted under 35 U.S.C. 154(b) by 318 days.

(21) Appl. No.: 12/333,565

(22) Filed: Dec. 12, 2008

(65) Prior Publication Data

US 2009/0157332 A1    Jun. 18, 2009

(30) Foreign Application Priority Data

Dec. 13, 2007   (KR) .................. 10-2007-0129810

(51) Int. Cl.
*G01R 21/00*         (2006.01)

(52) U.S. Cl. .......................................................... 702/60
(58) Field of Classification Search ..................... 702/60
    See application file for complete search history.

(56) References Cited

U.S. PATENT DOCUMENTS

| 6,670,799 | B1 * | 12/2003 | Bull et al. .................. 324/76.11 |
| 7,598,748 | B2 * | 10/2009 | Hachisuka et al. ............ 324/522 |
| 2005/0162144 | A1 * | 7/2005 | Kernahan ....................... 323/300 |

* cited by examiner

*Primary Examiner* — Aditya Bhat
(74) *Attorney, Agent, or Firm* — Lee, Hong, Degerman, Kang & Waimey

(57) ABSTRACT

Disclosed is an instrument transformer detecting an amount of power supplied to a load via a high voltage line, wherein the instrument transformer is integrally configured with a current level converter, a voltage level converter and a power amount calculating module so that it detects an amount of power supplied via the high voltage line and transmits the detected amount of power to a power amount management unit as a digital signal to correctly detect the amount of power.

17 Claims, 2 Drawing Sheets

INSTRUMENT TRANSFORMER AND APPARATUS FOR DETECTING AN AMOUNT OF POWER USING THE SAME

CROSS-REFERENCE TO RELATED APPLICATION

The present application is based on, and claims priority from, Korean Application Numbers 10-2007-0129810 filed Dec. 13, 2007, the disclosure of which is incorporated herein by reference in its entirety.

BACKGROUND

The following description relates generally to an instrument transformer and an apparatus for detecting an amount of power using the same, and more particularly, to an instrument transformer and an apparatus for detecting an amount of power using the same, which is capable of accurately detecting the amount of power supplied to a load via a high voltage line and transmitting the detected amount of power to an outer power amount control unit to cause it to be managed by the outer power amount control unit.

A level of current and voltage supplied to a load via a high voltage line is very high. Therefore, when detecting an amount of power supplied to the load via the high voltage line, the amount of power is allowed to be detected after current and voltage supplied via the high voltage line are changed from a high level to a low level using an instrument transformer.

The instrument transformer is typically equipped with a current level converter and a voltage level converter. The current level converter converts a high level current supplied via the high voltage line to a low level current. The voltage level converter converts a high level voltage supplied via the high voltage line into a low level voltage.

The low level current converted by the current level converter and the low level voltage converted by the voltage level converter in the instrument transformer are transmitted to a power meter, where the current and the voltage are multiplied with each other to detect an amount of power supplied to the load via the high voltage line.

The low level current outputted from the current level converter and low level voltage outputted from the voltage level converter in the instrument transformer are an analog signal.

Thus, in case a distance between the instrument transformer and the power meter is short, the instrument transformer can correctly transmit to the power meter the current and the voltage of analog signal converted to the low level to cause an amount of power supplied to the load to be exactly detected.

However, in case the distance between the instrument transformer and the power meter is long, the instrument transformer cannot correctly transmit to the power meter the current and the voltage of analog signal converted to the low level to generate a great number of errors when detecting the amount of power.

In other words, during transmitting an analog signal from the instrument transformer to the power meter, a great number of noises are induced and a level of analog signal is attenuated, whereby a great difference occurs between the amount of power detected by the power meter and actual amount of power supplied to the load via the high voltage line.

SUMMARY

An object of the present invention is to provide an instrument transformer capable of accurately detecting an amount of power supplied to a load via a high voltage line.

Another object of the present invention is to provide an apparatus for detecting an amount of power using an instrument transformer, which transmits the amount of power accurately detected by the instrument transformer to an outer power amount managing unit to allow it to be managed by the external power amount managing unit.

In order to achieve such objects, an instrument transformer according to the present invention comprises: a current/voltage level converting unit; and a power amount calculating module. The current/voltage level converting unit is comprised of a current level converter and a voltage level converter.

The current level converter converts a high level current supplied to the load via the high voltage line to a low level current using, for example, a current transformer or a Rogowski coil.

The voltage level converter converts a high level voltage supplied via the high voltage line to a low level voltage by dividing the high level voltage using voltage dividing resistors provided between the high voltage lines.

The power amount calculating module converts the low level current converted by the current level converter and the low level voltage converted by the voltage level converter into a digital signal, and then calculates an amount of power.

Thus, the instrument transformer according to the present invention is featured by the fact that the current/voltage level converting unit for converting a level of current and voltage supplied to the load via the high voltage line to a low level and the power amount calculating module for calculating an amount of power are integrally equipped.

Further, an apparatus for detecting an amount of power using the instrument transformer receives the amount of power calculated by the instrument transformer as a digital signal and stores the received amount of power in the memory to be managed and be displayed in the display unit.

DETAILED DESCRIPTION

Hereinafter, an instrument transformer and an apparatus for detecting an amount of power using the instrument transformer will be described in detail with reference to the accompanying drawings.

Figure 1:
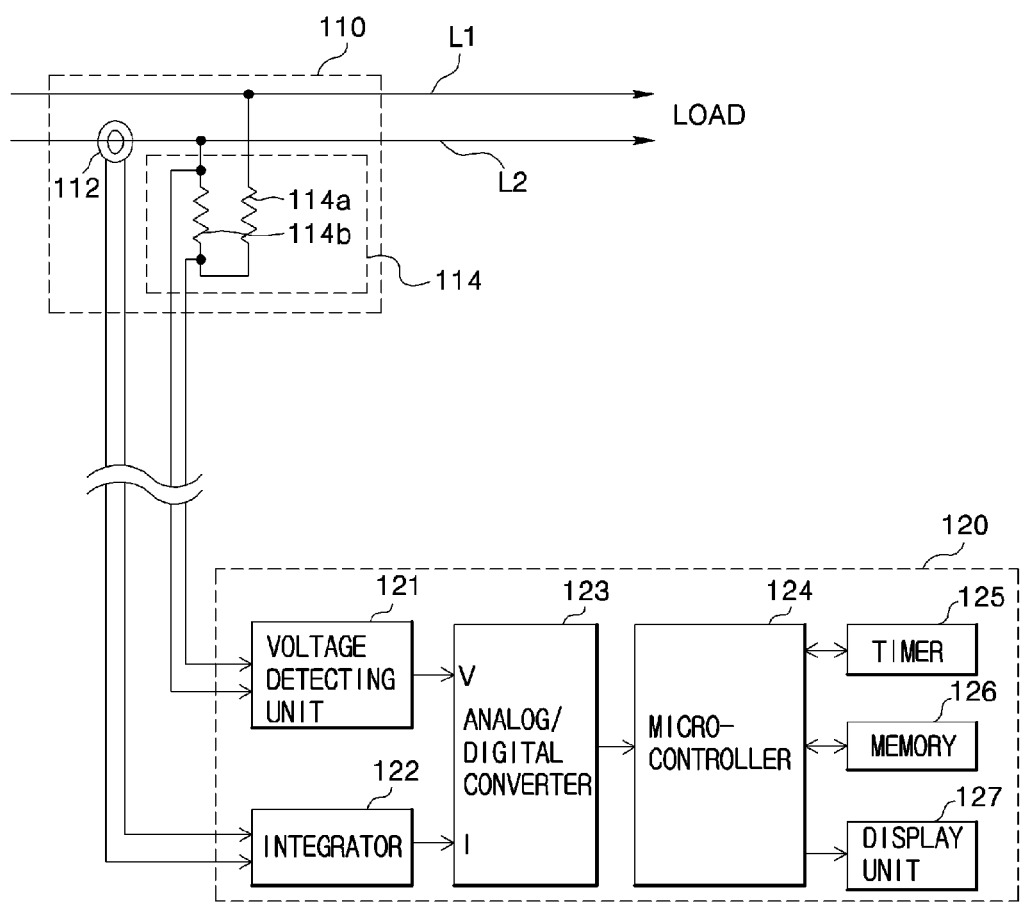
FIG. 1 is a block diagram showing a general structure of an apparatus for detecting an amount of power using an instrument transformer.

FIG. 1 is block diagram showing a general structure of an apparatus for detecting an amount of power using an instrument transformer. Reference numerals $L_1$ and $L_2$ are respectively high voltage lines supplying power to a load.

Reference numeral 110 is an instrument transformer. The instrument transformer 110 is configured with a current level converter 112 and a voltage level converter 114. The current level converter 112 converts a high level current supplied to a load via one of two high voltage lines $L_1$ and $L_2$, e.g., a high voltage line $L_2$ to a low level current.

The voltage level converter 114 converts a high level voltage supplied to the load via the high voltage line $L_1$ or $L_2$ to a low level voltage. For example, the voltage level converter 114 has voltage dividing resistors 114a and 114b connected in series between the high voltage lines $L_1$ and $L_2$ and the voltage dividing resistors 114a and 114b divide a high level voltage supplied to the load via the high voltage line $L_1$ or $L_2$ to convert it to a low level voltage.

The current converted by the current level converter 112 and the voltage converted by the voltage level converter 114 in the instrument transformer 110 are transmitted to the power meter 120 where an amount of power can be detected.

The power meter 120 includes a voltage detecting unit 121, an integrator 122, an analog/digital converter 123, a microcontroller 124, a timer 125, a memory 126 and a display unit 127.

The voltage converted by the voltage level converter 114 is inputted to the voltage detecting unit 121 of the power meter 120 where a level thereof is detected.

The current converted by the current level converter 112 is inputted to the integrator 121 of the power meter 120 where it is integrated.

The level of voltage detected by the voltage detecting unit 121 and the value of current integrated by the integrator 122 are converted to a digital signal and inputted to the microcontroller 125.

Then, the microcontroller 124 calculates an amount of power supplied to the load via the high voltage line $L_1$ or $L_2$ using the voltage and the current inputted from the analog/digital converter 123. In other words, the microcontroller 124 calculates the amount of power by multiplying the voltage and the current with each other.

The microcontroller 125 stores and manages the calculated amount of power in the memory 126 in accordance with current time information counted by a timer 124, and outputs the calculated amount of power to a display unit 127 where it is displayed.

The apparatus for detecting an amount of power transfers the low level current and the low level voltage converted by the instrument transformer 110 to the power meter 120 and allows the power meter 120 to calculate and control the amount of power by multiplying the low level current and the low level voltage transferred.

The current and the voltage transmitted from the instrument transformer 110 to the power meter 120 are an analog signal.

Thus, in case a distance between the instrument transformer 110 and the power meter 120 is short, the power meter 120 can correctly receive the current and the voltage of analog signal transmitted from the instrument transformer 110 to correctly calculate the amount of power supplied to the load via the high voltage line $L_1$ or $L_2$.

However, in case the distance between the instrument transformer 110 and the power meter 120 is long, a great number of noises are induced while the instrument transformer 110 transmits the current and the voltage of analog signal to the power meter 120 and an intensity of the analog signal is attenuated. Therefore, a large difference occurs between the amount of power calculated by the power meter 120 and the amount of power actually supplied to the load via the high voltage line $L_1$ or $L_2$. Such difference further increases as the distance between the instrument transformer 110 and the power meter 120 becomes long.

Figure 2:
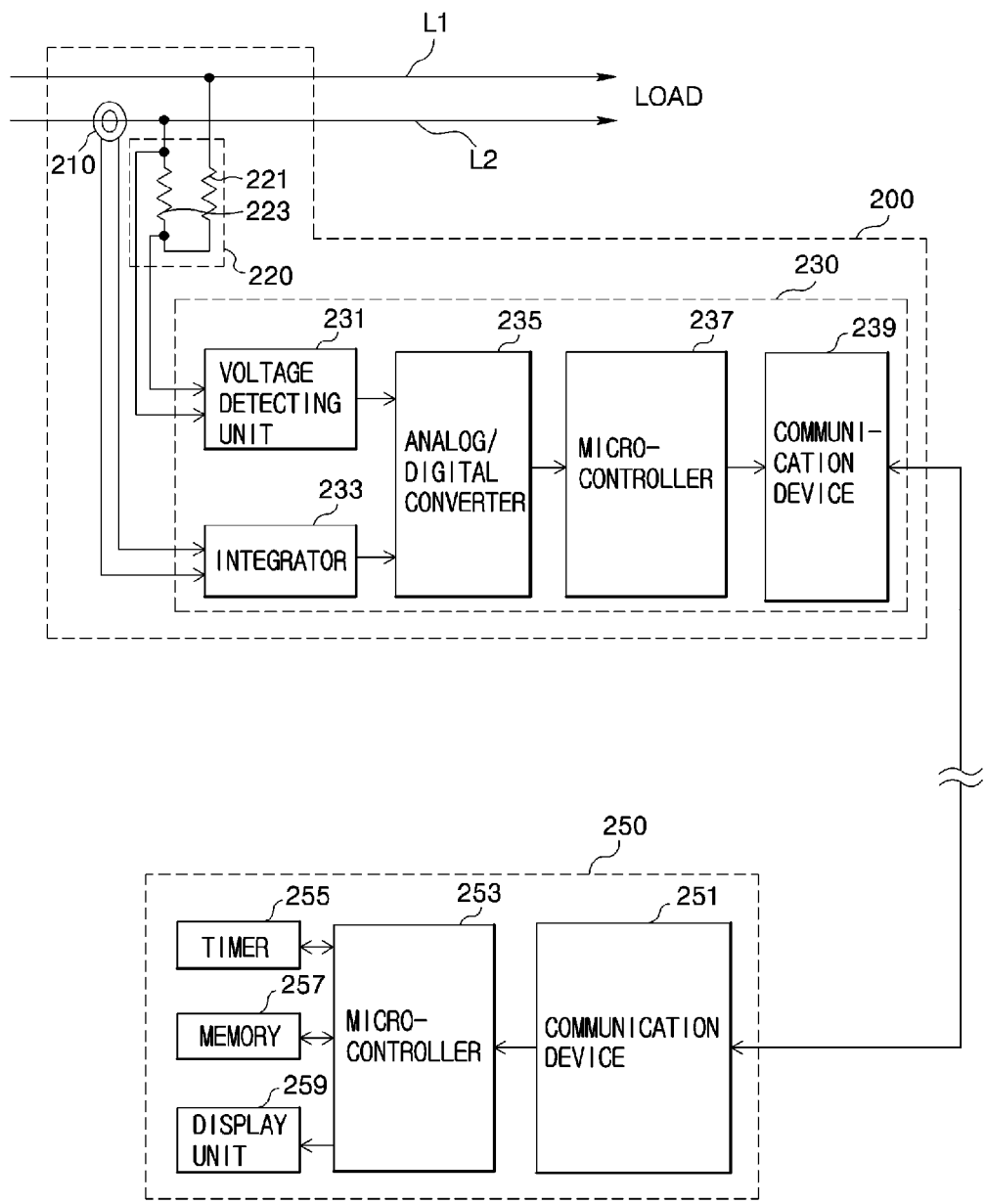
FIG. 2 is a block diagram showing a structure of an apparatus for detecting an amount of power using an instrument transformer according to preferable embodiment of the present invention.

FIG. 2 is a block diagram showing a structure of an apparatus for detecting an amount of power using the instrument transformer according to a preferable embodiment of the present invention. Here, reference numeral 200 is an instrument transformer calculating the amount of power supplied to the load via the high voltage line L1 or L2.

The instrument transformer 200 is integrally equipped with a current level converter 210, a voltage level converter 220 and a power amount calculating module 230.

The current level converter 210 has a current transformer or Rogowski coil provided in one high voltage line of the two high voltage lines $L_1$ and $L_2$, e.g., a high voltage line $L_2$ to detect a current supplied to the load via the high voltage line $L_2$.

The voltage level converter 220 converts a high level voltage supplied to the load via the high voltage line $L_1$ or $L_2$ to a low level voltage. For example, the voltage level converter 220 has voltage dividing resistors 221, 223 connected in series between the high voltage lines $L_1$ and $L_2$, and the voltage dividing resistors 221, 223 divide the high level voltage supplied to the load via the high voltage line $L_1$ or $L_2$ to convert it to the low level voltage.

The current detected by the current level converter 210 and the voltage converted by the voltage level converter 220 are inputted to the power amount calculating module 230.

The power amount calculating module 230 is configured with a voltage detecting unit 231, an integrator 233, an analog/digital converter 235, a microcontroller 237 and a communication device 239.

The voltage converted by the voltage level converter 220 is inputted to the voltage detecting unit 231 of the power amount calculating model 230 where its level is detected. The current detected by the current level converter 210 is inputted to the integrator 233 of the power amount calculating module 230 as a differential value which is an amount of change with the lapse of time and integrated by the integrator 233.

The voltage level detected by the voltage detecting unit 231 and the current integrated by the integrator 233 are converted to the digital signal by the analog/digital converter 235 and then inputted to the microcontroller 237.

Then, the microcontroller 237 calculates the amount of power by calculating the current and the voltage inputted from the analog/digital converter 235 and the calculated amount of power is transmitted to the outer power amount management unit 250 via the communication device 239. The communication device 239 preferably transmits the amount of power as a digital signal.

Such instrument transformer 200 according to the present invention is integrally configured with the current level converter 210, the voltage level converter 220 and the power amount calculating module 230 so that it can correctly calculate the amount of power supplied to the load via the high voltage line $L_1$ or $L_2$.

The amount of power transmitted by the communication device 239 of the power amount calculating module 230 is received by the power amount management unit 250.

The power amount management unit 250 includes a communication device 251, a microcontroller 253, a timer 255, a memory 257 and a display unit 259.

The amount of power transmitted from the communication device 239 of the power amount calculating module 230 is received by the communication device 251 of the power amount management unit 250 and the amount of power received is input to the microcontroller 253.

Then, the microcontroller 253 allows the amount of power inputted from the communication device 251 to be stored in the memory 257 and to be managed in accordance with current time information counted by the timer 255 and allows the amount of power to be output to the display unit 259 to display it.

According to the apparatus for detecting the amount of power using the instrument transformer according to the present invention, the amount of power correctly calculated by the instrument transformer 200 is transmitted as a digital signal and the amount of power transmitted is received and managed by the power amount calculating module 230.

Since the amount of power is transmitted as a digital signal, even though the distance between the instrument transformer 200 and the power amount management unit 250 is long, the noise signal is not induced and the signal is not attenuated. Consequently, the amount of power supplied to the load via the high voltage line $L_1$ or $L_2$ can be correctly calculated by the instrument transformer 200 and the calculated amount of power can be correctly managed and displayed by the power amount management unit 250.

While the present novel concept has been described with reference to the particular illustrative implementations, it is not to be restricted by those implementations but only by the appended claims. It is to be appreciated that those skilled in the art can change or modify the implementations without departing from the scope and sprit of the present.

What is claimed is:

1. An instrument transformer, comprising:
   a current/voltage level converting unit configured to convert a level of current or voltage supplied to a load, via a high voltage line, to a low level; and
   a power amount calculating module configured to calculate an amount of power of a signal output from the current/voltage level converting unit and to transmit the calculated amount of power, via a communication device, to a power amount management unit,
   wherein the power amount management unit is configured to output the calculated amount of power via a display unit, and
   wherein the current/voltage level converting unit and the power amount calculating module are disposed within a same unit.

2. The instrument transformer of claim 1, wherein the current/voltage level converting unit comprises:
   a current level converter configured to convert a current supplied to the load via the high voltage line to a low level current; and
   a voltage level converter configured to convert a voltage supplied to the load via the high voltage line to a lower level voltage.

3. The instrument transformer of claim 2, wherein the current level converter is a current transformer.

4. The instrument transformer of claim 2, wherein the current level converter is a Rogowski coil.

5. The instrument transformer of claim 2, wherein the voltage level converter is a voltage dividing resistor configured to divide a voltage of the high voltage line.

6. The instrument transformer of claim 1, wherein the power amount calculating module comprises:
   a voltage detecting unit configured to detect a level of the voltage output by the current/voltage level converting unit;
   an integrator configured to integrate the current output by the current/voltage level converting unit; and
   a microcontroller configured to calculate the amount of power of signals output from the voltage detecting unit and the integrator.

7. The instrument transformer of claim 6, further comprising an analog/digital converter configured to convert an output signal of the voltage detecting unit and an output signal of the integrator to a digital signal and to output the digital signal to the microcontroller,
   wherein the analog/digital converter is disposed between the voltage detecting unit and the integrator and the microprocessor.

8. The instrument transformer of claim 1, wherein the power amount management unit is not housed in the same unit as the current/voltage level converting unit and the power amount calculating module.

9. An apparatus for detecting an amount of power using an instrument transformer, the apparatus comprising:
   an instrument transformer configured to calculate an amount of power supplied to a load via a high voltage line, the instrument transformer comprising:
   a current/voltage level converting unit configured to convert a level of a current or a voltage supplied to a load via a high voltage line to a low level, and
   a power amount calculating module configured to calculate an amount of power from a signal output from the current/voltage level converting unit and to transmit the calculated amount of power, via a communication device, to a power amount control unit,
   wherein the power amount control unit is configured to output the calculated amount of power via a display unit; and
   a power amount control unit configured to control the amount of power calculated by the instrument transformer,
   wherein the current/voltage level converting unit and the power amount calculating module are disposed within a same unit.

10. The apparatus of claim 9, wherein the current/voltage level converting unit comprises:
    a current level converter configured to convert a current supplied to the load via the high voltage line to a low level current; and
    a voltage level converter configured to convert a voltage supplied to the load via the high voltage line to a low level voltage.

11. The apparatus of claim 10, wherein the current level converter is a current transformer.

12. The apparatus of claim 10, wherein the current level converter is a Rogowski coil.

13. The apparatus of claim 10, wherein the voltage level converter is a voltage dividing resistor which divides a voltage of the high voltage line.

14. The apparatus of claim 9, wherein the power amount calculating module comprises:
    a voltage detecting unit configured to detect a level of the voltage output by the current/voltage level converting unit;
    an integrator configured to integrate a current output by the current/voltage level converting unit; and
    a microcontroller configured to calculate the amount of power from signals output from the voltage detecting unit and the integrator.

15. The apparatus of claim 14, further comprising an analog/digital converter configured to convert an output signal of the voltage detecting unit and an output signal of the integrator to a digital signal and output the converted signal to the microcontroller,
    wherein the analog/digital converter is disposed between the voltage detecting unit and the integrator and the microprocessor.

16. The apparatus of claim 9, wherein the power amount control unit comprises:
    a communication device configured to receive the calculated amount of power output by the power amount calculating module;
    a microcontroller configured to manage and display the calculated amount of power received by the communication device;

a timer configured to calculate a current time and output the current time to the microcontroller, such that the microcontroller can manage the calculated amount of power in accordance with the calculated current time; and a memory configured to store information of the calculated amount of power managed by the microcontroller.

17. The apparatus of claim 9, wherein the power amount control unit is not housed in the same unit as the current/voltage level converting unit and the power amount calculating module.

* * * * *